United States Patent
Solaski et al.

(10) Patent No.: US 10,339,776 B2
(45) Date of Patent: Jul. 2, 2019

(54) SECURITY MARKER

(71) Applicants: Thomas Solaski, Boca Raton, FL (US); Hubert A. Patterson, Boca Raton, FL (US); Gopal Chandramowle, Boca Raton, FL (US)

(72) Inventors: Thomas Solaski, Boca Raton, FL (US); Hubert A. Patterson, Boca Raton, FL (US); Gopal Chandramowle, Boca Raton, FL (US)

(73) Assignee: Sensormatic Electronics LLC, Boca Raton, FL (US)

( * ) Notice: Subject to any disclaimer, the term of this patent is extended or adjusted under 35 U.S.C. 154(b) by 0 days.

(21) Appl. No.: 15/812,929

(22) Filed: Nov. 14, 2017

(65) Prior Publication Data

US 2019/0147714 A1 May 16, 2019

(51) Int. Cl.
*G08B 13/14* (2006.01)
*G08B 13/24* (2006.01)
*H03H 3/06* (2006.01)
*H03H 9/22* (2006.01)

(52) U.S. Cl.
CPC ....... *G08B 13/2442* (2013.01); *G08B 13/244* (2013.01); *H03H 3/06* (2013.01); *H03H 9/22* (2013.01)

(58) Field of Classification Search
None
See application file for complete search history.

(56) References Cited

U.S. PATENT DOCUMENTS

| | | | | |
|---|---|---|---|---|
| 5,859,587 A * | 1/1999 | Alicot | ............... | G08B 13/2417 340/551 |
| 6,426,700 B1 * | 7/2002 | Lian | ................... | G08B 13/2408 340/572.4 |
| 7,135,979 B2 * | 11/2006 | Savagian | ......... | G06K 19/07749 340/572.8 |
| 7,385,512 B2 * | 6/2008 | Shih | ...................... | B29D 22/00 235/492 |
| 7,561,043 B2 * | 7/2009 | Hasegawa | .......... | G08B 13/2408 340/568.1 |
| 7,779,533 B2 * | 8/2010 | Peter | .................. | G08B 13/2408 148/311 |
| 2002/0140558 A1 * | 10/2002 | Lian | ....................... | G01V 15/00 340/572.8 |
| 2003/0020612 A1 * | 1/2003 | Lian | ................... | G08B 13/2408 340/572.6 |
| 2004/0207528 A1 | 10/2004 | Fabian et al. | | |
| 2006/0038636 A1 * | 2/2006 | Tsurumi | .................. | H03H 3/04 333/191 |

(Continued)

*Primary Examiner* — Chico A Foxx
(74) *Attorney, Agent, or Firm* — Fox Rothschild LLP; Robert J. Sacco; Carol E. Thorstad-Forsyth

(57) ABSTRACT

Systems and methods for making a marker. The methods comprise: disposing a resonator with a flat planar cross-sectional profile in a cavity formed in a first substrate partially defining a marker housing; sealing the cavity using a second substrate; placing a first bias element adjacent to the second substrate so that the resonator will be biased by the first bias element when the marker is in use to oscillate at a frequency of a received transmit burst; and using a physical structure in the cavity or a magnetic field passing through the cavity to reduce frictional forces between the resonator and at least the second substrate.

16 Claims, 8 Drawing Sheets

(56) References Cited

U.S. PATENT DOCUMENTS

| | | | |
|---|---|---|---|
| 2006/0169688 A1* | 8/2006 | Mori | B23K 35/24 |
| | | | 219/444.1 |
| 2007/0290857 A1* | 12/2007 | Li | G08B 13/2408 |
| | | | 340/572.6 |
| 2008/0030338 A1* | 2/2008 | Liu | G08B 13/2408 |
| | | | 340/572.6 |
| 2008/0136571 A1* | 6/2008 | Peter | G08B 13/2408 |
| | | | 335/306 |
| 2008/0155822 A1* | 7/2008 | Finn | G06K 19/07745 |
| | | | 29/832 |
| 2009/0195386 A1* | 8/2009 | Peter | G08B 13/2408 |
| | | | 340/572.1 |
| 2010/0259391 A1* | 10/2010 | Gadonniex | G08B 13/2408 |
| | | | 340/572.6 |
| 2010/0259393 A1* | 10/2010 | Marur | G06K 19/07749 |
| | | | 340/572.8 |
| 2012/0018523 A1* | 1/2012 | Launay | G06K 19/07745 |
| | | | 235/492 |
| 2014/0218197 A1 | 8/2014 | Li | |
| 2015/0356842 A1 | 12/2015 | Zirk et al. | |
| 2016/0351034 A1 | 12/2016 | Trivelpiece et al. | |
| 2017/0272050 A1* | 9/2017 | Umeda | B81B 3/00 |

\* cited by examiner

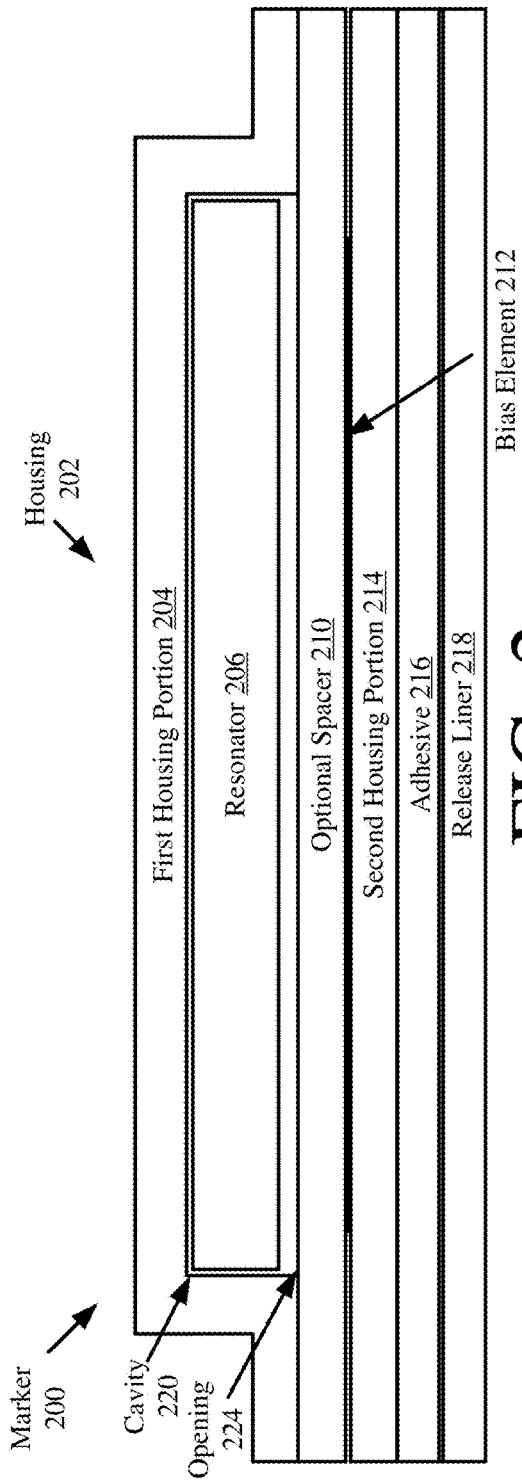
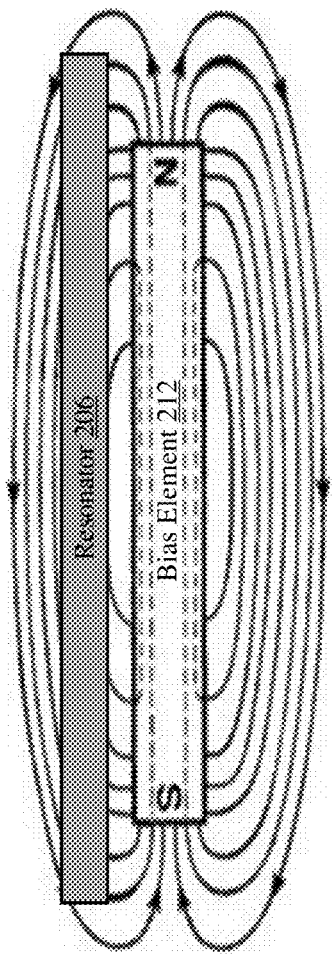
FIG. 2
(Prior Art)
FIG. 3
(Prior Art)

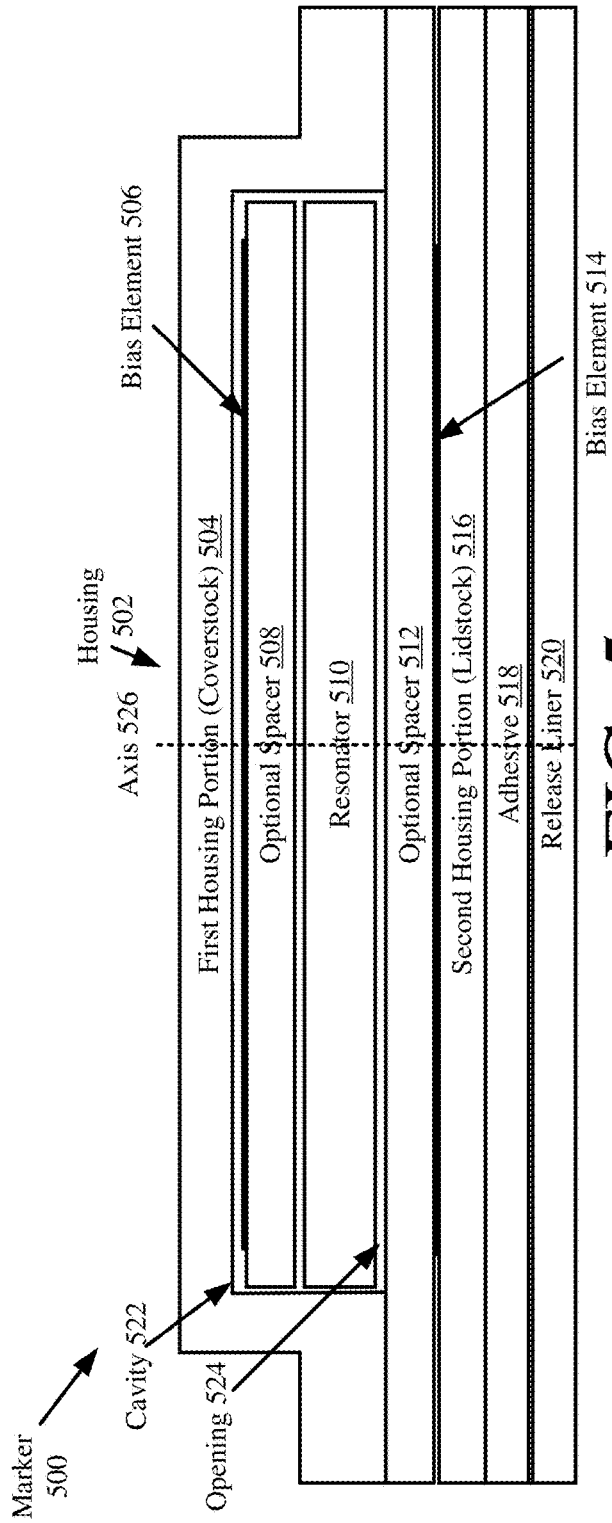
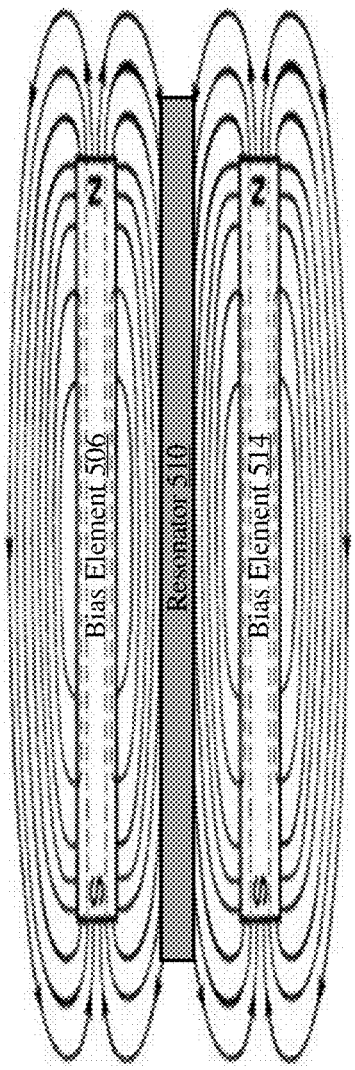
FIG. 5
FIG. 6

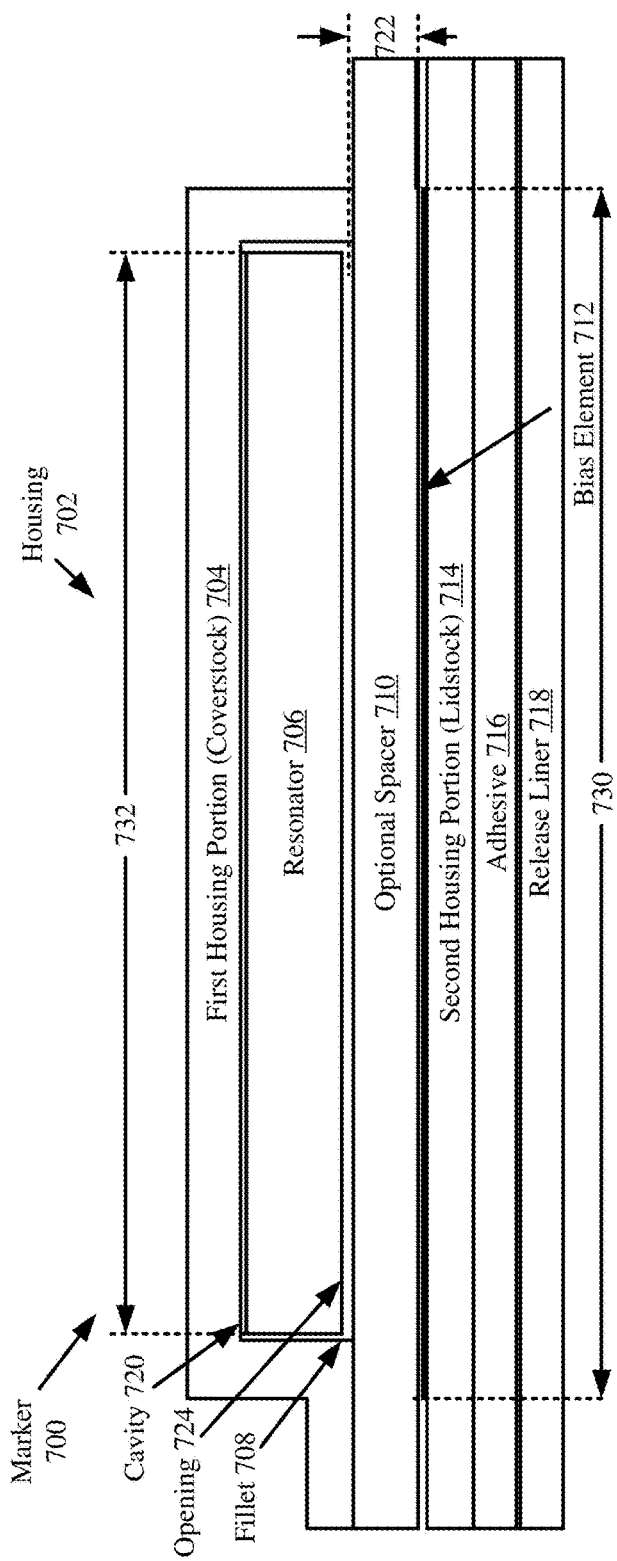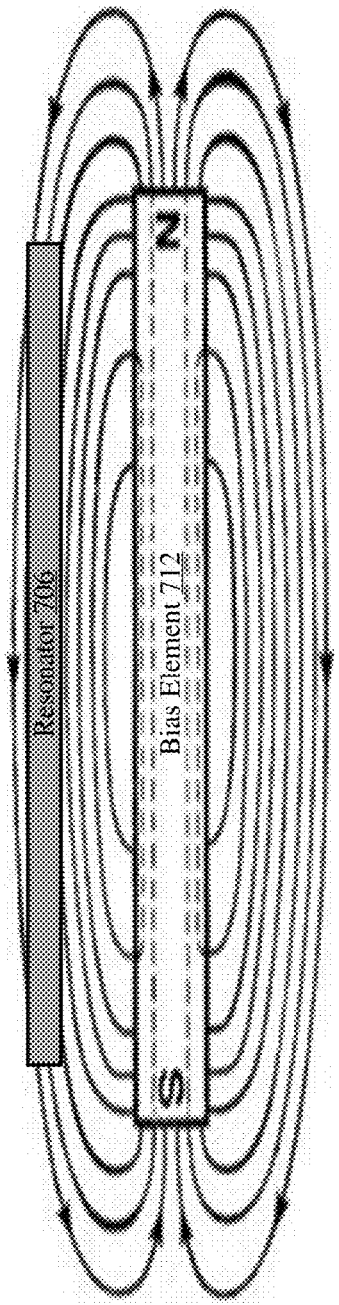
FIG. 7
FIG. 8

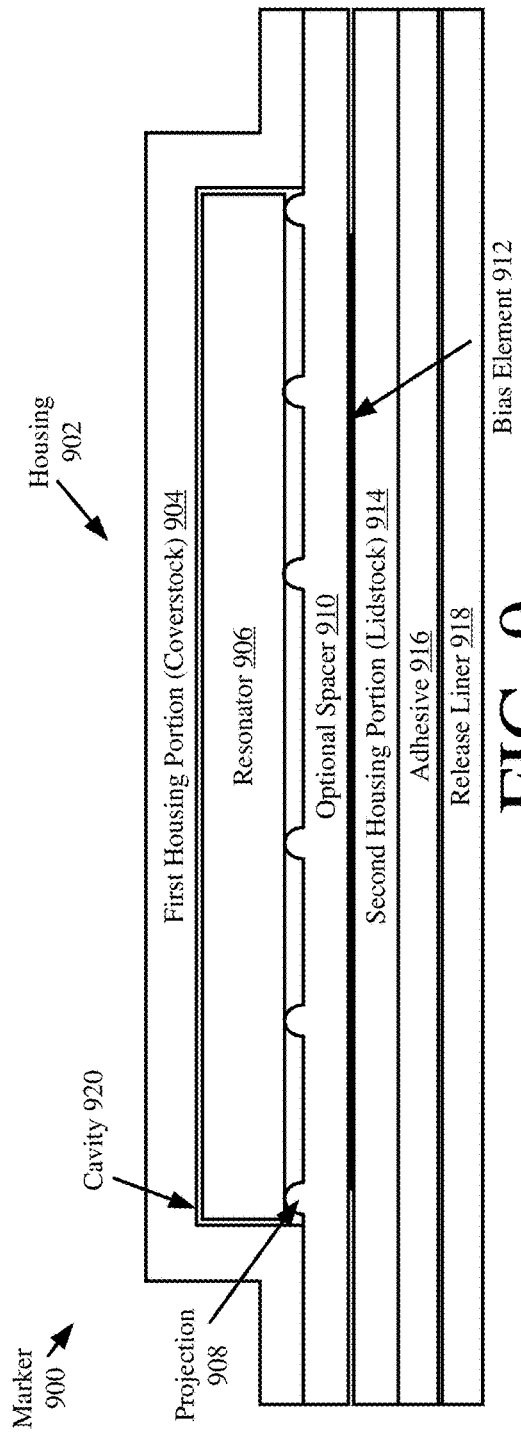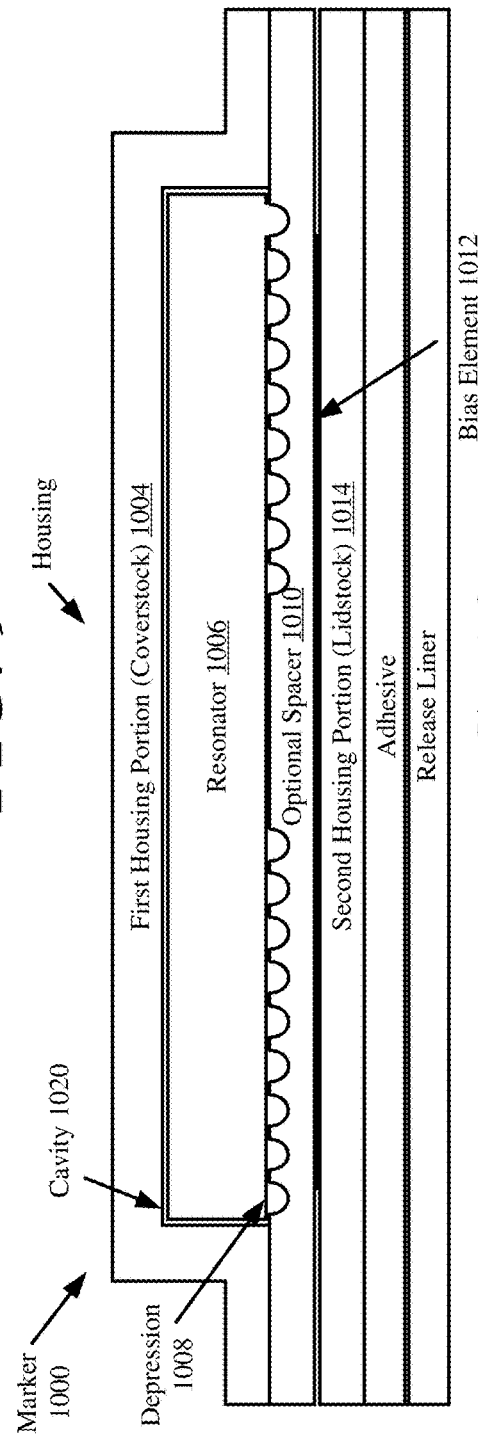

SECURITY MARKER

FIELD

This document relates generally to security markers. More particularly, this document relates to security markers with reduced damping due to friction between resonators and surrounding materials.

BACKGROUND

A typical Electronic Article Surveillance ("EAS") system in a retail setting may comprise a monitoring system and at least one security tag or marker attached to an article to be protected from unauthorized removal. The monitoring system establishes a surveillance zone in which the presence of security tags and/or markers can be detected. The surveillance zone is usually established at an access point for the controlled area (e.g., adjacent to a retail store entrance and/or exit). If an article enters the surveillance zone with an active security tag and/or marker, then an alarm may be triggered to indicate possible unauthorized removal thereof from the controlled area. In contrast, if an article is authorized for removal from the controlled area, then the security tag and/or marker thereof can be deactivated and/or detached therefrom. Consequently, the article can be carried through the surveillance zone without being detected by the monitoring system and/or without triggering the alarm.

The security tag or marker generally consists of a housing. The housing is made of a low cost plastic material, such as polystyrene. The housing is typically manufactured with a drawn cavity in the form of a rectangle. A bias magnet is disposed within the housing adjacent to one or more magnetoelastic resonator. The bias magnet is made of a semi-hard magnetic material. The resonator(s) is(are) made of a soft magnetic material in the form of an elongate thin ribbon produced by rapid quenching. During operation, the security tag or marker produces a resonant signal with a particular amplitude that is detectable by the monitoring system. Notably, markers with a single resonator have about 65% of the amplitude of markers with two resonators. As such, single resonator markers have reduced system performance as compared to dual resonator markers.

Common Acousto-Magnetic ("AM") EAS markers are designed to provide maximum output signal in the smallest package possible in order to allow the markers to be placed on a wide range of products and hard goods. A key design element of these markers is the incorporation of a transverse curl to the resonator component(s) of the marker. This curl results in increased stiffness of the resonator which enhances the resonator's ability to overcome magnetic clamping and frictional damping due to the reduction in surface area contact between the resonator and the cavity surface.

However, certain product categories (including small, narrow items such as lipsticks and other cosmetics) are not easily tagged due to the narrow and/or curved nature of the packaging. Therefore, it is highly desirable to reduce the width of the AM EAS marker to something significantly smaller than the current, nominal width of 10.5 mm of most AM EAS marker (e.g., 5-7 mm) in order to expand the range of products capable of being tagged with the AM EA marker.

Attempts to create such a narrow label have been hindered by the difficulty in developing a resonator of the required dimensions with a transverse curl. Attempts to use a traditionally annealed, flat, resonator ribbon experience excessive clamping leading to reduced amplitude making the tag more difficult to detect, or requiring additional resonator components making the AM EAS markers more expensive.

SUMMARY

Systems and methods are described herein for making a marker. The methods comprise: disposing a resonator with a flat planar cross-sectional profile in a cavity formed in a first substrate partially defining a marker housing; sealing the cavity using a second substrate; placing a first bias element adjacent to the second substrate so that the resonator will be biased by the first bias element when the marker is in use to oscillate at a frequency of a received transmit burst; and using a physical structure in the cavity or a magnetic field passing through the cavity to reduce frictional forces between the resonator and at least the second substrate.

In some scenarios, the physical structure comprises a narrow strip of material formed at the interface of the first and second substrate during a heat sealing process. The narrow strip of material physically supports and lifts the resonator off of the second substrate.

In those or other scenarios, the physical structure comprises a textured surface of at least the second substrate. The textured surface comprises: a plurality of protrusions extending from at least the second substrate in a direction towards the resonator; and/or a plurality of depressions extending from at least the second substrate in a direction away from resonator.

In those or other scenarios, the physical structure comprises a mesh material, a screen material or a perforated sheet material.

In some scenarios, the magnetic field is produced by: (A) a second bias element disposed on a side of the resonator that is opposite to the side of the resonator where the first bias element resides; or (B) the first bias element that is longer than the resonator. In at least the second case (B), the magnetic field lines of the magnetic field enter the resonator at opposing ends of its elongate body.

DESCRIPTION OF THE DRAWINGS

The present solution will be described with reference to the following drawing figures, in which like numerals represent like items throughout the figure.

FIG. 2 is an illustration of an illustrative conventional marker.

FIG. 3 is an illustration of the magnetic flux lines of the bias element of FIG. 2.

FIG. 5 is an illustration of another illustrative marker designed in accordance with the present solution.

FIG. 6 is an illustration of the magnetic flux lines of the bias element of FIG. 5.

FIG. 7 is an illustration of another illustrative marker designed in accordance with the present solution.

FIG. 8 is an illustration of the magnetic flux lines of the bias element of FIG. 7.

FIG. 9 is an illustration another illustrative marker designed in accordance with the present solution.

FIG. 10 is an illustration of another illustrative marker designed in accordance with the present solution.

DETAILED DESCRIPTION

Figure 1:
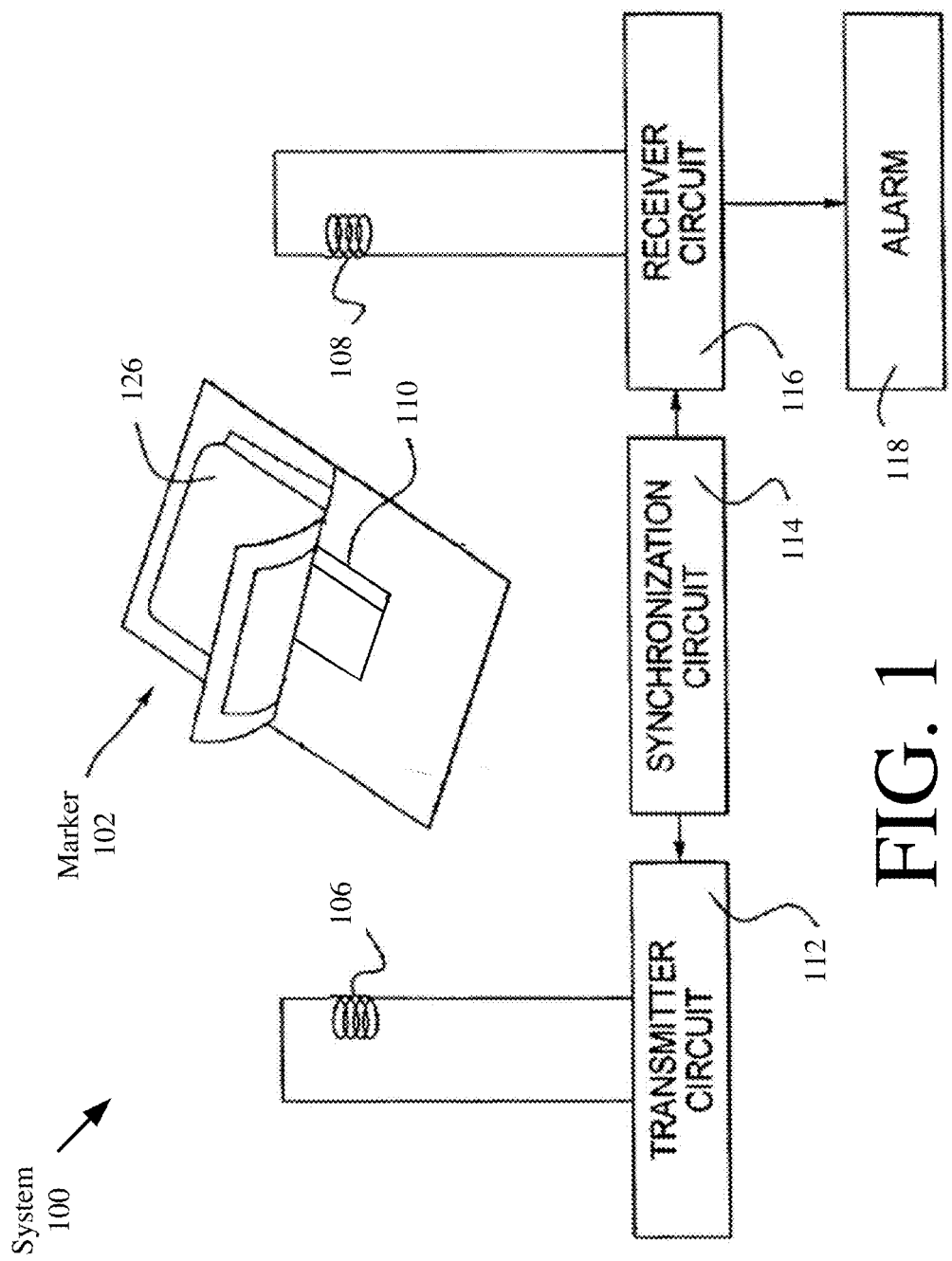
FIG. 1 is an illustration of an illustrative system comprising a marker.

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present solution may be embodied in other specific forms without departing from its spirit or essential characteristics. The described embodiments are to be considered in all respects only as illustrative and not restrictive. The scope of the present solution is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present solution should be or are in any single embodiment of the present solution. Rather, language referring to the features and advantages is understood to mean that a specific feature, advantage, or characteristic described in connection with an embodiment is included in at least one embodiment of the present solution. Thus, discussions of the features and advantages, and similar language, throughout the specification may, but do not necessarily, refer to the same embodiment.

Furthermore, the described features, advantages and characteristics of the present solution may be combined in any suitable manner in one or more embodiments. One skilled in the relevant art will recognize, in light of the description herein, that the present solution can be practiced without one or more of the specific features or advantages of a particular embodiment. In other instances, additional features and advantages may be recognized in certain embodiments that may not be present in all embodiments of the present solution.

Reference throughout this specification to "one embodiment", "an embodiment", or similar language means that a particular feature, structure, or characteristic described in connection with the indicated embodiment is included in at least one embodiment of the present solution. Thus, the phrases "in one embodiment", "in an embodiment", and similar language throughout this specification may, but do not necessarily, all refer to the same embodiment.

As used in this document, the singular form "a", "an", and "the" include plural references unless the context clearly dictates otherwise. Unless defined otherwise, all technical and scientific terms used herein have the same meanings as commonly understood by one of ordinary skill in the art. As used in this document, the term "comprising" means "including, but not limited to".

The present solution concerns overcomes the shortcomings of previous flat-resonator marker designs by minimizing the surface contact of the resonator with the surrounding label cavity material thereby reducing the damping due to friction. By minimizing the signal loss of the marker, one can design a smaller marker with adequate amplitude so that an additional resonator is not required. Therefore, the cost is kept to a minimum while providing a marker capable of being used on smaller, narrower packaging without loss of performance.

Careful heat sealing of the upper (coverstock) and lower (lidstock) layers of the cavity material, via control of pressure, temperature and material thickness, creates a fillet (or narrow strip of material) at the interface of the two layers. This fillet, coupled with the tight dimensional tolerances of the cavity relative to the resonator component, is able to support/lift the edges of the resonator and "break" the surface tension between the resonator and substrate, reducing the amount of areal contact and friction thus allowing the resonator to vibrate more freely. Additionally or alternatively, the decrease in surface area contact is achieved by creating a textured surface within the cavity by forming protrusions (e.g., ridges and/or bumps) or depressions (e.g., divots and/or dimples) on one or more of the cavity's sidewalls.

Other design modifications/changes can also be introduced to reduce the magnetic clamping associated with the magnetic field of the bias element and/or also minimizing the frictional forces between the resonator and cavity substrate. Magnetic clamping can be reduced via changes to the construction and configuration of the bias element. Current markers only include a single bias element located under the resonator such that the resonator is pulled down onto a spacing layer. By placing a bias element above and below the resonator, the attractive force of the resonator is reduced between the two bias elements. As a result, the magnetic attractive forces are also reduced, as well as the frictional forces between the resonator and the substrate.

Another configuration uses a single, elongated bias component design to reorient the magnetic flux field surrounding the resonator component to reduce the normal forces on the resonator (pulling the resonator down on the substrate). Existing label designs use bias elements lengths that are comparable to, or shorter than, the length of the resonator. This reduces the amount of material needed, and provides close coupling with the resonator. However, the resulting magnetic attraction is strong and directed normal to the surface of the resonator pulling it down on the substrate and increasing the frictional forces. The present solution uses a longer bias element with a greater spacing between the bias element and the resonator. This configuration allows the magnetic flux lines to flow through the resonator parallel to its surface, reducing the normal attractive force and the surface friction.

Finally, in order to further reduce the surface contact between the bias element and the resonator, a mesh or screen spacer material is substituted for the traditional multi-ply plastic lidstock film used to separate the bias element from the resonator. Using a textured film, screen, mesh or perforated sheet as the spacer element significant reduces the surface area available to physically contact the resonator and generate friction capable of damping the signal.

Illustrative EAS System

Referring now to FIG. 1, there is provided a schematic illustration of an illustrative EAS system 100. The EAS system 100 comprises a monitoring system 106-112, 114-118 and at least one marker 102. The marker 102 may be attached to an article to be protected from unauthorized removal from a business facility (e.g., a retail store). The monitoring system comprises a transmitter circuit 112, a synchronization circuit 114, a receiver circuit 116 and an alarm 118.

During operation, the monitoring system 106-112, 114-118 establishes a surveillance zone in which the presence of the marker 102 can be detected. The surveillance zone is usually established at an access point for the controlled area (e.g., adjacent to a retail store entrance and/or exit). If an article enters the surveillance zone with an active marker 102, then an alarm may be triggered to indicate possible unauthorized removal thereof from the controlled area. In contrast, if an article is authorized for removal from the controlled area, then the marker 102 can be deactivated and/or detached therefrom. Consequently, the article can be carried through the surveillance zone without being detected by the monitoring system and/or without triggering the alarm 118.

The operations of the monitoring system will now be described in more detail. The transmitter circuit 112 is coupled to the antenna 106. The antenna 106 emits transmit (e.g., "Radio Frequency ("RF")") bursts at a predetermined frequency (e.g., 58 KHz) and a repetition rate (e.g., 50 Hz, 60 Hz, 75 Hz or 90 Hz), with a pause between successive bursts. In some scenarios, each transmit burst has a duration of about 1.6 ms. The transmitter circuit 112 is controlled to emit the aforementioned transmit bursts by the synchronization circuit 114, which also controls the receiver circuit 116. The receiver circuit 116 is coupled to the antenna 108. The antenna 106, 108 comprises close-coupled pick up coils of N turns (e.g., 100 turns), where N is any number.

When the marker 102 resides between the antennas 106, 108, the transmit bursts transmitted from the transmitter 112, 108 cause a signal to be generated by the marker 102. In this regard, the marker 102 comprises a stack 110 (e.g., a resonator and a bias element) disposed in a marker housing 126. The transmit bursts emitted from the transmitter 112, 108 drive the resonator to oscillate at a resonant frequency (e.g., 58 KHz). As a result, a signal is produced with an amplitude that decays exponentially over time.

The synchronization circuit 114 controls activation and deactivation of the receiver circuit 116. When the receiver circuit 116 is activated, it detects signals at the predetermined frequency (e.g., 58 KHz) within first and second detection windows. In the case that a transmit burst has a duration of about 1.6 ms, the first detection window will have a duration of about 1.7 ms which begins at approximately 0.4 ms after the end of the transmit burst. During the first detection window, the receiver circuit 116 integrates any signal at the predetermined frequency which is present. In order to produce an integration result in the first detection window which can be readily compared with the integrated signal from the second detection window, the signal emitted by the marker 102 should have a relatively high amplitude (e.g., greater than or equal to about 1.5 nanowebers (nWb)).

After signal detection in the first detection window, the synchronization circuit 114 deactivates the receiver circuit 116, and then re-activates the receiver circuit 116 during the second detection window which begins at approximately 6 ms after the end of the aforementioned transmit burst. During the second detection window, the receiver circuit 116 again looks for a signal having a suitable amplitude at the predetermined frequency (e.g., 58 kHz). Since it is known that a signal emanating from the marker 102 will have a decaying amplitude, the receiver circuit 116 compares the amplitude of any signal detected at the predetermined frequency during the second detection window with the amplitude of the signal detected during the first detection window. If the amplitude differential is consistent with that of an exponentially decaying signal, it is assumed that the signal did, in fact, emanate from a marker between antennas 106, 108. In this case, the receiver circuit 116 issues an alarm 118.

Illustrative Marker Architectures

The marker 102 of FIG. 1 can have many different structures depending on a given application. Illustrative marker architectures will be described below. Marker 102 can have the same or substantially similar architecture as any one of the markers discussed herein.

Referring now to FIG. 2, there is provided an illustration of an illustrative conventional marker 200. The conventional marker 200 comprises a housing 202 formed of a first housing portion 204 and a second housing portion 214. The housing 202 can include, but is not limited to, a high impact polystyrene. An adhesive 216 and release liner 218 are disposed on the bottom surface of the second housing portion 214 so that the marker 200 can be attached to an article (e.g., a piece of merchandise or product packaging).

A cavity 220 is formed in the first housing portion 204. A resonators 206 is disposed in the cavity 220. The resonator 206 has a generally rectangular shape and a planar cross-sectional profile. A spacer 210 is optionally disposed so as to seal an opening 224 of the cavity 220 whereby the resonator 206 is securely disposed and retained in the cavity 220. The spacer 210 can include, but is not limited to, a low density polyethylene.

A bias element 212 is disposed between the spacer 210 and the second housing portion 214. The bias element 212 includes, but is not limited to, an iron-based semi-hard magnet. The spacer 210 is optionally provided so that the physical spacing of and between the bias element 212 and the resonator 208 can be maintained. In FIG. 2, the bias element 212 is shown as being thinner than the resonator 208. This is not drawn to scale. Typically, the bias element 212 has a thickness that is the same as or greater than the thickness of the resonator 208, as shown in FIG. 3.

FIG. 3 shows the magnetic flux lines of the bias element 212 being applied to the resonator 206. As shown in FIG. 3, the resonator 206 is located in the middle of the magnetic field. In effect, the magnetic flux lines run generally normal to the length of the resonator. Consequently, the resonator 206 is pulled towards the bias element 212.

Notably, the conventional marker 200 suffers from certain drawbacks. For example, the conventional marker 200 experiences magnetic clamping and frictional damping due to the surface contact between the resonator 206 and second housing portion 214 (or alternatively optional spacer 210). Also, the conventional marker 200 is relatively wide, and therefore cannot be used with small, narrow and curved items (e.g., lipstick).

The present solution overcomes these drawbacks of the conventional marker 200. The manner in which the drawbacks of the conventional marker 200 are overcome by the present solution will be become evident as the discussion progresses.

Figure 4:
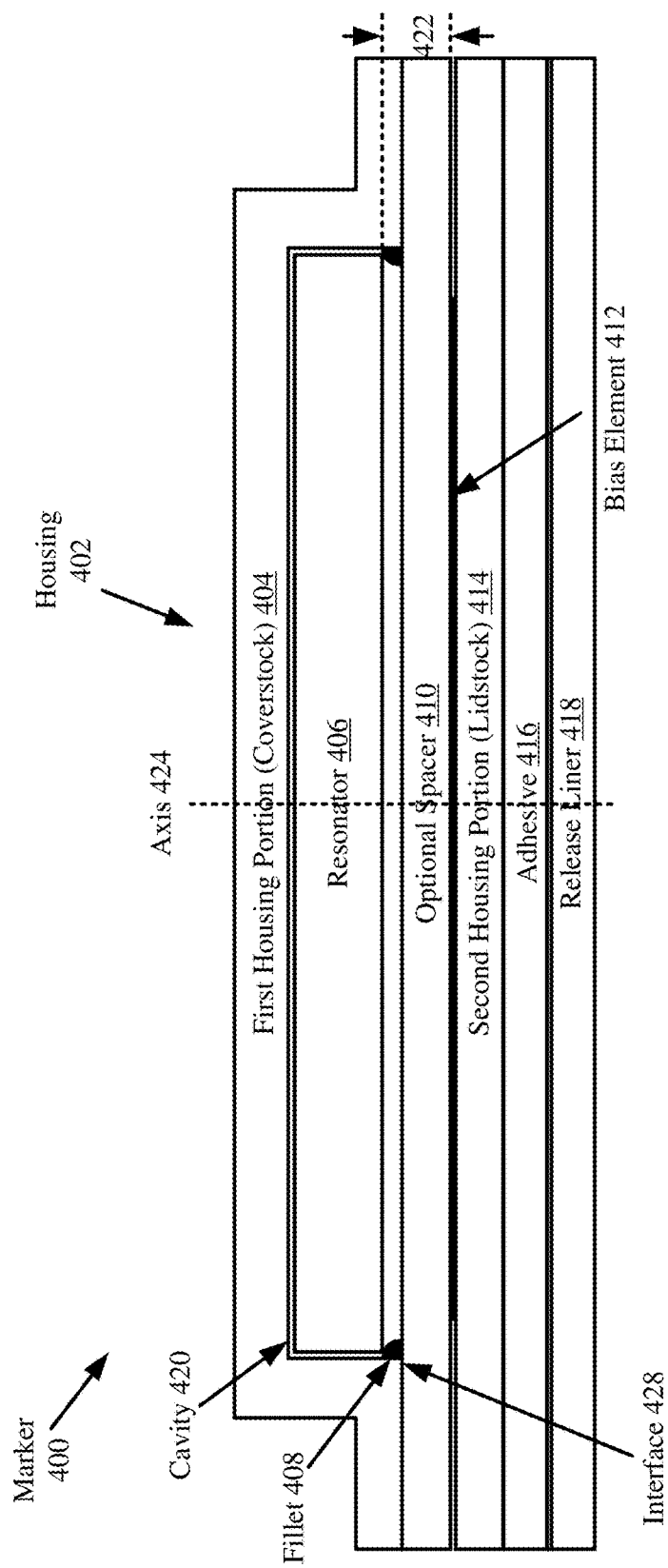
FIG. 4 is an illustrative marker designed in accordance with the present solution.

Referring now to FIG. 4, there is provided a more detailed illustration of a marker 400 designed in accordance with the present solution. Marker 400 has a decreased amount of magnetic clamping and frictional damping as compared to that of conventional marker 200 shown in FIG. 2. The decreased amount of magnetic clamping and frictional damping of marker 400 at least partially results from the inclusion of a fillet 408 at the interface of the first housing portion 404 and the second housing portion 414 (or alternatively an optional spacer 410). The fillet 408 circumscribes the cavity 420 at the interface 428. The fillet 408 lifts and supports the resonator 406 disposed in the cavity 420, without sticking thereto. As a result, the surface tension is broken between the resonator and the underlying substrate material. The resonator is allowed to more freely vibrate as a consequence of its reduced amount of areal contact and friction with the underlying substrate material. Thus, the signal amplitude of the marker 400 is not degraded as is the case in the conventional marker 200.

The fillet 408 is created during a heat sealing process for sealing the first housing portion 404 to a lower substrate layer 410 or 414. In this regard, various parameters of the heat sealing process are carefully and strictly controlled. These parameters include, but are not limited to, pressure, temperature, time, vacuum and shrink rate. Also, the thickness of the first housing portion 404 can be selected to ensure that the fillets will indeed be created during the heat sealing process. Heat sealing processes for sealing two substrates together are well known in the art, and therefore will not be described herein. Any known or to be known heat sealing process can be used herein without limitation.

The resonator has a generally rectangular shape with a flat planar cross-sectional profile. The resonator 406 can be formed of any suitable resonator material. An illustrative suitable resonator material is made from Fe, Co and Ni as main elements. Thus, the resonator material can have a chemical composition of $Fe_aCo_bNi_cSi_dB_e$, wherein a, b, c, d and e are in atomic percent. The values of a-e can respectively fall within the following ranges: $22 \leq a \leq 36$; $10 \leq b \leq 13$; $43 \leq c \leq 49$; $1 \leq d \leq 4$; and $15 \leq e \leq 17$. For example, the resonator material may have a chemical composition $Fe_{24}Co_{12}Ni_{46}Si_2B_{16}$. The atomic percentages for Fe, Co and Ni may vary approximately ±5% from the stated values for atomic percent.

The bias element 412 is formed of any suitable bias material. An illustrative suitable bias material is a semi-hard magnetic material, such as the material designated as "SensorVac", which is available from Vacuumschmelze, Hanau, Germany. The bias element 412 is in a ribbon-shaped length of the semi-hard magnetic material. In some scenarios, the bias element 412 has a width of equal to or less than 6 mm and a thickness of equal to or less than 48 microns. The present solution is not limited to the particulars of this scenarios.

In FIG. 4, the bias element 412 is shown as being thinner than the resonator 406. The present solution is not limited in this regard. The bias element 212 can alternatively have a thickness that is the same as or greater than the thickness of the resonator 406.

In order to place the bias element 412 in an activated condition, the bias element is magnetized substantially to saturation with the polarity of magnetization parallel to the length of the bias element. To deactivate the marker, the magnetic state of the bias element is substantially changed by degaussing the bias element via the application of an AC magnetic field. When the bias element 412 is degaussed, it no longer provides the bias field required to cause the resonator 406 to oscillate at the operating frequency of the EAS system. The marker may also be deactivated by imparting an alternating series of magnetic poles (i.e., N-S-N-S-N-S-N) along the length of the bias element. This breaks up the bias field on the resonators and substantially deactivates the label.

The resonator 406 is disposed vertically along axis 424 so as to be disposed above the bias element 412. The resonator 406 may be spaced apart from the bias element 412 via optional spacer 410. The spacer 410 is formed of any suitable material, such as plastic. The thickness of the spacer 410 is selected in accordance with a particular application. In some scenarios, the spacer 410 has a thickness greater than or equal to 10 mils. The spacing 422 between the resonator 406 and bias element 412 is selected to optimize the bias field applied to the resonator while minimizing the magnetic damping effect caused by the attraction of the resonator to the bias element. Magnetic clamping/damping results in a shift in resonant frequency and a loss of amplitude, therefore it needs to be minimized. For example, increasing the spacing 422 reduces the effective bias field while also reducing the magnetic clamping. However, this increases the overall height and/or thickness of the marker. So the spacing 422 helps tune the marker 400 to the proper frequency while optimizing the efficiency of the system (i.e., amplitude). The spacer is optionally included in marker 400 at least partially based on the desired distance 422 between the resonator 406 and bias element 412.

As noted above, the resonator 406 is placed in a cavity 420 formed in the housing 402. In this regard, the housing 302 comprises a first housing portion 404 and a second housing portion 414. The cavity 420 is sized and shaped to respectively receive the resonator 406. The size and shape of the cavity is selected in accordance with the respective resonator's geometry.

The housing 402 can include, but is not limited to, a high impact polystyrene. An adhesive 416 and release liner 418 are disposed on the bottom surface of the housing 402 so that the marker 400 can be attached to an article (e.g., a piece of merchandise).

Referring now to FIG. 5, there is provided an illustration of another illustrative marker 500 in accordance with the present solution. Marker 500 has an increased amplitude as compared to that of conventional marker 200 shown in FIG. 2. The increased amplitude of marker 500 at least partially results from the placement of two bias elements 506, 514 on opposing sides of the resonator 510. Magnetic attraction of the resonator 510 is split between the two bias elements 506, 514, and therefore mutually canceled so as to reduce the magnetic clamping of the marker 500. By using two pieces of bias material placed above and below the resonator, the attractive force of the resonator between the bias elements is balanced, as shown by FIG. 6. This balancing provides a reduced magnetic attractive force to each bias element, and reduced frictional forces between the resonator and the material of the layers above and below the resonator.

The resonator 510 can be formed of any suitable resonator material. This material can be the same as or similar to that used to form resonator 406 of FIG. 4. The resonator 510 has a generally rectangular shape with a flat planar cross-sectional profile.

The bias elements 506, 514 are formed of any suitable bias material. An illustrative suitable bias material is a semi-hard magnetic material, such as the material designated as "SensorVac", which is available from Vacuumschmelze, Hanau, Germany. Each bias element 506, 514 is in a ribbon-shaped length of the semi-hard magnetic material. Each bias element 506, 514 has a width of equal to or greater than 6 mm and a thickness of equal to or less than 48 microns. The width depends on the thickness, flux, resonator coupling, and/or spacing.

In FIG. 5, the bias elements 506, 514 are shown as being thinner than the resonator 510. The present solution is not limited in this regard. Each bias element 506, 514 can alternatively have a thickness that is the same as or greater than the thickness of the resonator 510.

In order to place the bias elements 506, 514 in an activated condition, the bias element is magnetized substantially to saturation with the polarity of magnetization parallel to the length of the bias element. To deactivate the marker, the magnetic state of the bias element is substantially changed by degaussing the bias element via the application of an AC magnetic field. When the bias elements 506, 514 are degaussed, they no longer provide the bias field required to cause the resonator 510 to oscillate at the operating frequency of the EAS system.

The bias elements 506, 514 and resonator 510 are vertically stacked along axis 526 so as to have a generally parallel arrangement. The bias elements 506, 514 are also respectively disposed above and below the resonator 510 by the same distance. In effect, the bias elements 506, 514 are equally spaced apart from and/or bias the same resonator 510. The bias elements 506, 514 may be spaced apart from the resonator 510 via optional spacers 508, 512. Spacers 508, 512 can be the same as or similar to spacer 410 of FIG. 4. The added spacer 512 provides a relatively thin surface (e.g., plastic surface) for the resonators to sit on so it does not directly sit on the bias element 514. Similarly, the added spacer 508 provides a relatively thin surface (e.g., plastic surface) for the upper bias element 506 to sit on so it does not directly sit on the resonator 510. Intimate contact between the resonators and bias elements produces excessive clamping. In some scenarios, the spacers 508, 512 each have a thickness of 4-8 mils.

As shown in FIG. 5, the resonator 510 and bias element 506 are placed in the cavity 522 formed in the housing 502. In this regard, the housing 502 comprises a first housing portion 504 with a cavity 522 formed therein. The cavity 522 is sized and shaped to at least receive the resonator 510 and bias element 506.

The housing 502 can include, but is not limited to, a high impact polystyrene. An adhesive 518 and release liner 520 are disposed on the bottom surface of the housing 502 so that the marker 500 can be attached to an article (e.g., a piece of merchandise or product packaging).

Referring now to FIG. 7, there is provided an illustration of an illustrative marker 700 designed in accordance with the present solution. Marker 700 has an increased amplitude as compared to that of conventional marker 200 shown in FIG. 2. The increased amplitude of marker 700 at least partially results from (A) the use of a bias element 712 with an elongated length 730 greater than the length 732 of the resonator 706, and/or (b) the increased distance between the bias element 712 and resonator 706. Notably, the marker 700 architecture of FIG. 7 is similar to that of: FIG. 2 except for the bias element has a longer length; and FIG. 4 except for the bias element has a longer length, the marker 700 is absent of the fillet 408, and/or the resonator/bias element distance is greater. These changes cause the magnetic flux lines to be re-oriented. As shown in FIG. 3, the magnetic flux lines in the conventional marker 300 design enter the resonator normal to the surface plane of the resonator (and therefore, the spacer substrate) creating an attractive force that increases (or magnifies) the frictional forces between the resonator and the substrate surface. As shown in FIG. 8, the magnetic flux lines of marker 700 enter the resonator at the ends, creating magnetic attraction parallel to the resonator surface. Consequently, there is a minimization of the normal forces that enhance the friction between resonator and substrate.

The resonator 706 can be formed of any suitable resonator material. This material can be the same as or similar to that used to form resonator 206 of FIG. 2 and/or resonator 406 of FIG. 4. The resonator 706 is shown in FIG. 7 as having a generally rectangular shape with a flat planar cross-sectional profile.

The bias element 712 is formed of any suitable bias material. An illustrative suitable bias material is a semi-hard magnetic material, such as the material designated as "SensorVac", which is available from Vacuumschmelze, Hanau, Germany. The bias element 712 is in a ribbon-shaped length of the semi-hard magnetic material. The bias element 712 has a width of equal to or less than 6 mm and a thickness of equal to or less than 48 microns.

In FIG. 7, the bias element 712 is shown as being thinner than the resonator 706. The present solution is not limited in this regard. The bias element 712 can alternatively have a thickness that is the same as or greater than the thickness of the resonator 706.

In order to place the bias element 712 in an activated condition, the bias element is magnetized substantially to saturation with the polarity of magnetization parallel to the length 730 of the bias element. To deactivate the marker, the magnetic state of the bias element is substantially changed by degaussing the bias element via the application of an AC magnetic field. When the bias element is degaussed, it no longer provides the bias field required to cause the resonator 706 to oscillate at the operating frequency of the EAS system.

The resonator 706 is disposed along an axis 732 so as to reside above the bias element 712 and have a generally parallel arrangement therewith. The spacing 722 between each resonator and the bias element is selected to prevent magnetic clamping.

The resonator 706 is placed in the cavity 720 formed in the housing 702. In this regard, the housing 702 comprises a first housing portion 704 and a second housing portion 714, which are coupled to each other. The cavity 720 is sized and shaped to receive the resonator 706.

The housing 702 can include, but is not limited to, a high impact polystyrene. An adhesive 716 and release liner 718 are disposed on the bottom surface of a second housing portion 714 so that the marker 700 can be attached to an article (e.g., a piece of merchandise).

Referring now to FIG. 9, there is provided an illustration of an illustrative marker 900 designed in accordance with the present solution. Marker 900 has an increased amplitude as compared to that of conventional marker 200 shown in FIG. 2. The increased amplitude of marker 900 at least partially results from the provision of a cavity 920 with at least one textured sidewall surface. The textured sidewall surface can include, but is not limited to, dimples, projections 908, and/or apertures. The cavity sidewall(s) can be formed at least partially by a mesh material, a screen material, a perforated sheet, and/or other textured sheet. The textured sidewall surface(s) reduces the surface contact between the resonator 906 and the adjacent substrate material. The textured sidewall surface can be provided by the first housing portion 904, the second housing portion 914, and/or an optional spacer 910.

Although FIG. 9 shows an optional spacer 910 with at least six protrusions 908, the present solution is not limited in this regard. Any number of protrusions can be provided at any location(s) along the substrate's surface adjacent to the resonator. Also, the protrusions can have any shape. For example, the protrusions have generally triangular cross-sectional profiles as opposed to semi-circular cross-sectional profiles as shown in FIG. 9. The shape of the protrusions is selected in accordance with a particular application (e.g., minimize the degree or amount of contact between the resonator and the below substrate on which it sits).

The resonator 906 can be formed of any suitable resonator material. This material can be the same as or similar to that used to form resonators 406 of FIG. 4. The resonator has a generally rectangular shapes with a flat planar cross-sectional profiles.

The bias element 912 can be formed of any suitable bias material. An illustrative suitable bias material is a semi-hard magnetic material, such as the material designated as "SensorVac", which is available from Vacuumschmelze, Hanau, Germany.

In FIG. 9, the bias element 912 is shown as being thinner than the resonator 906. The present solution is not limited in this regard. The bias element 912 can alternatively have a thickness that is the same as or greater than the thickness of the resonator 906.

In order to place the bias element 912 in an activated condition, the bias element is magnetized substantially to saturation with the polarity of magnetization parallel to the length of the bias element. To deactivate the marker, the magnetic state of the bias element is substantially changed by degaussing the bias element via the application of an AC magnetic field. When the bias element is degaussed, it no longer provides the bias field required to cause the resonator 906 to oscillate at the operating frequency of the EAS system.

As noted above, the resonator 906 is placed in the cavity 920 formed in the housing 902. In this regard, the housing 902 comprises a first housing portion 904 with the cavity 920 formed therein. The housing 902 can include, but is not limited to, a high impact polystyrene. An adhesive 916 and release liner 918 are disposed on the bottom surface of a second housing portion 914 so that the marker 900 can be attached to an article (e.g., a piece of merchandise).

Referring now to FIG. 10, there is provided an illustration of an illustrative marker 1000 designed in accordance with the present solution. Marker 1000 is similar to marker 900, albeit different in some ways. The discussion of marker 900 is sufficient for understanding marker 1000.

Marker 1000 has an increased amplitude as compared to that of conventional marker 200 shown in FIG. 2. The increased amplitude of marker 1000 at least partially results from the provision of a cavity 1020 with at least one textured sidewall surface. The textured sidewall surface includes depressions 1008. The cavity sidewall(s) can be formed at least partially by a textured sheet. The textured sidewall surface(s) reduces the surface contact between the resonator 1006 and the adjacent substrate material. The textured sidewall surface can be provided by the first housing portion 1004, the second housing portion 1014, and/or an optional spacer 1010.

Although FIG. 10 shows an optional spacer 1010 with at least eighteen depressions 1008, the present solution is not limited in this regard. Any number of depressions can be provided at any location(s) along the substrate's surface adjacent to the resonator. Also, the depressions can have any shape. For example, the depressions have generally rectangular or square cross-sectional profiles as opposed to semi-circular cross-sectional profiles as shown in FIG. 10. The shape of the depressions is selected in accordance with a particular application (e.g., minimize the degree or amount of contact between the resonator and the below substrate on which it sits).

Figure 11:
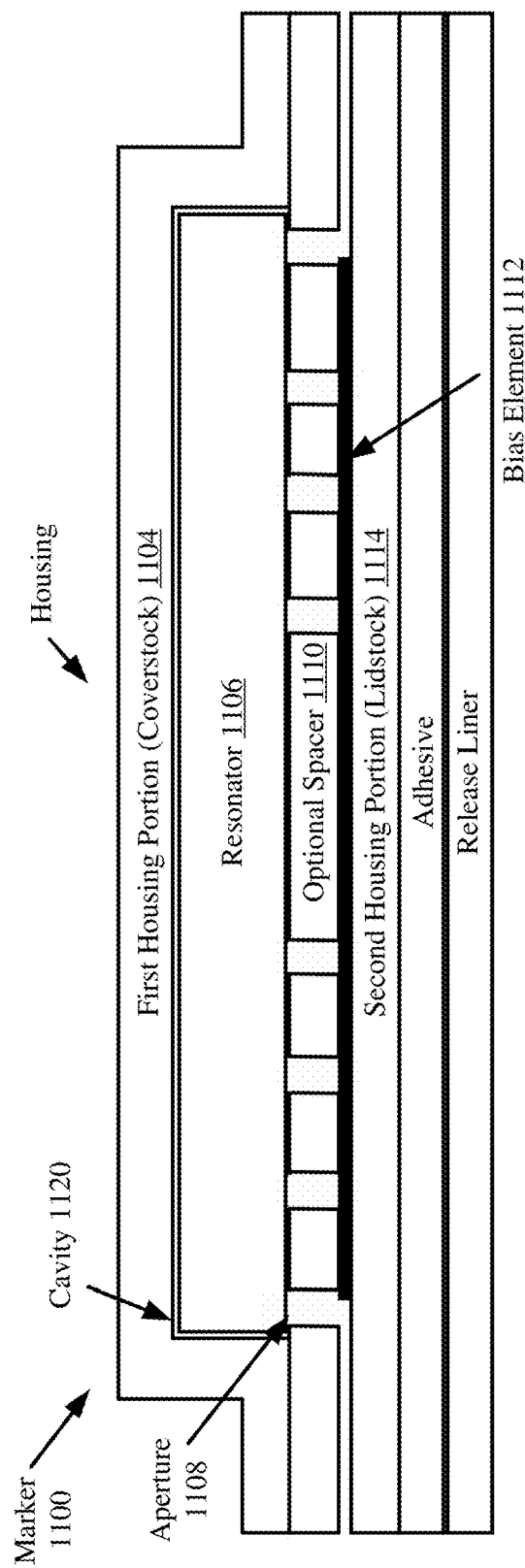
FIG. 11 is an illustration of another illustrative marker designed in accordance with the present solution.

Referring now to FIG. 11, there is provided an illustration of an illustrative marker 1000 designed in accordance with the present solution. Marker 1100 is similar to marker 900, albeit different in some ways. The discussion of marker 900 is sufficient for understanding marker 1100.

Marker 1100 has an increased amplitude as compared to that of conventional marker 200 shown in FIG. 2. The increased amplitude of marker 1100 at least partially results from the provision of a cavity 1120 with at least one textured sidewall surface. The textured sidewall surface includes apertures 1108. The cavity sidewall(s) can be formed at least partially by a mesh material, a screen material, and/or a textured sheet material. The textured sidewall surface(s) reduces the surface contact between the resonator 1106 and the adjacent substrate material. The textured sidewall surface can be provided by the first housing portion 1104, the second housing portion 1114, and/or an optional spacer 1110.

Although FIG. 11 shows an optional spacer 1110 with at least eight apertures 1108, the present solution is not limited in this regard. Any number of apertures can be provided at any location(s) along the substrate's surface adjacent to the resonator. Also, the apertures can have any shape. The shape of the apertures is selected in accordance with a particular application (e.g., minimize the degree or amount of contact between the resonator and the below substrate on which it sits).

Although FIGS. 9-11 show markers with only one type of texturing, the present solution is not limited in this regard. For example, a marker can comprise a fillet, protrusions, depressions, and/or apertures.

Figure 12:
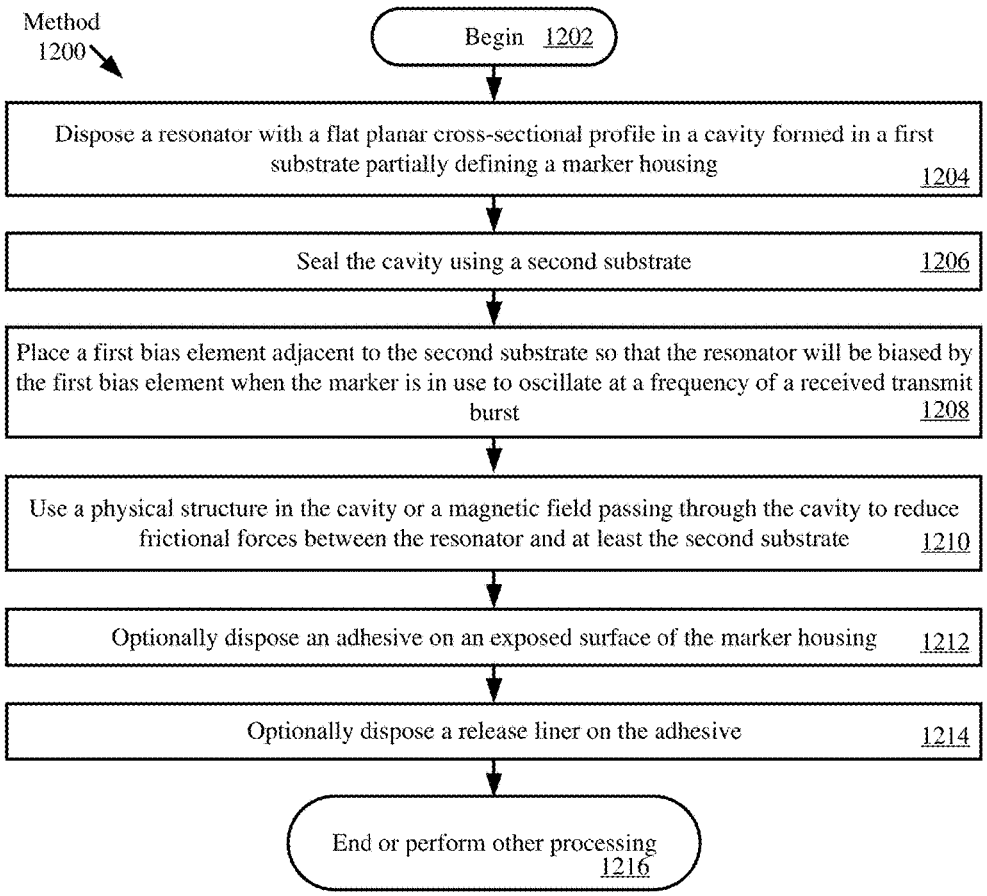
FIG. 12 is a flow diagram of an illustrative method for making a marker.

Referring now to FIG. 12, there is provided a flow diagram of an illustrative method 1200 for making a marker. Method 1200 begins with step 1202 and continues with step 1204. Step 1204 involves disposing a resonator (e.g., resonator 406 of FIG. 4, 510 of FIG. 5, 706 of FIG. 7, 906 of FIG. 9, 1006 of FIG. 10, or 1106 of FIG. 11) with a flat planar cross-sectional profile in a cavity (e.g., cavity 420 of FIG. 4, 522 of FIG. 5, 720 of FIG. 7, 920 of FIG. 9, 1020 of FIG. 10, or 1120 of FIG. 11) formed in a first substrate (e.g., first housing portion 404 of FIG. 4, 504 of FIG. 5, 704 of FIG. 7, 904 of FIG. 9, 1004 of FIG. 10, or 1104 of FIG. 11) partially defining a marker housing (e.g., housing 402 of FIG. 4, 504 of FIG. 5, 702 of FIG. 7, 902 of FIG. 9, or 1004 of FIG. 10). The cavity is then sealed by a second substrate (e.g., second housing portion 414 of FIG. 4, 516 of FIG. 5, 714 of FIG. 7, 914 of FIG. 9, 1014 of FIG. 10, or 1114 of FIG. 11 or optional spacer 410 of FIG. 4, 512 of FIG. 5, 710 of FIG. 7, 910 of FIG. 9, 1010 of FIG. 10, or 1110 of FIG. 11), as shown by 1206. In next 1208, a first bias element (e.g., bias element 412 of FIG. 4, 514 of FIG. 5, 712 of FIG. 7, 912 of FIG. 9, 1012 of FIG. 10, 1012 of FIG. 10, or 1112 of FIG. 11) is placed adjacent to the second substrate so that the resonator will be biased by the first bias element when the marker is in use to oscillate at a frequency of a received transmit burst.

A physical structure in the cavity or a magnetic field passing through the cavity is used in 1210 to reduce frictional forces between the resonator and at least the second substrate. In some scenarios, the physical structure comprises a narrow strip of material (e.g., fillet 408 of FIG. 4) formed at the interface of the first and second substrate (e.g., interface 428 of FIG. 4) during a heat sealing process. The narrow strip of material physically supports and lifts the resonator off of the second substrate. In those or other scenarios, the physical structure comprises a textured surface of at least the second substrate. The textured surface comprises: a plurality of protrusions extending from at least the second substrate in a direction towards the resonator; and/or a plurality of depressions extending from at least the second substrate in a direction away from resonator. In those or yet other scenarios, the physical structure comprises a mesh material, a screen material or a perforated sheet material.

The magnetic field is produced by: (A) a second bias element disposed on a side of the resonator that is opposite to the side of the resonator where the first bias element resides; and/or (B) the first bias element that is longer than the resonator. The magnetic field lines of the magnetic field may be oriented such that they enter the resonator at opposing ends of its elongate body.

In optional 1212, an adhesive is disposed on an exposed surface of the marker housing. In optional 1214, a release liner is disposed on the adhesive. The adhesive and release liner provide a means for allowing the marker to be selectively coupled to an item (e.g., a piece of merchandise or product packaging). Subsequently, 1216 is performed where method 1200 ends or other processing is performed.

All of the apparatus, methods, and algorithms disclosed and claimed herein can be made and executed without undue experimentation in light of the present disclosure. While the present solution has been described in terms of preferred embodiments, it will be apparent to those having ordinary skill in the art that variations may be applied to the apparatus, methods and sequence of steps of the method without departing from the concept, spirit and scope of the present solution. More specifically, it will be apparent that certain components may be added to, combined with, or substituted for the components described herein while the same or similar results would be achieved. All such similar substitutes and modifications apparent to those having ordinary skill in the art are deemed to be within the spirit, scope and concept of the present solution as defined.

The features and functions disclosed above, as well as alternatives, may be combined into many other different systems or applications. Various presently unforeseen or unanticipated alternatives, modifications, variations or improvements may be made by those skilled in the art, each of which is also intended to be encompassed by the disclosed embodiments.

We claim:

1. A method of making a marker, comprising:
   disposing a resonator with a flat planar cross-sectional profile in a cavity formed in a first substrate partially defining a marker housing;
   sealing an opening of the cavity using a second substrate;
   placing a first bias element adjacent to the second substrate so that the resonator will be biased by the first bias element when the marker is in use to oscillate at a frequency of a received transmit burst; and
   using a physical structure in the cavity to reduce frictional forces between the resonator and at least the second substrate, where the physical structure comprises at least one of
   (a) a portion of the first or second substrate that is located at an interface of the first and second substrates, protrudes out and into the cavity, and physically supports only edges of the resonator,
   (b) a textured sidewall of the cavity defined by the second substrate having a plurality of protruding textured shapes; and
   (c) a non-conductive mesh material, screen material, or perforated sheet material forming the second substrate.

2. The method according to claim 1, wherein the portion of the first or second structure in (a) comprises a narrow strip of material formed at the interface of the first and second substrate during a heat sealing process.

3. The method according to claim 2, wherein the narrow strip of material physically lifts the resonator off of the second substrate.

4. The method according to claim 1, wherein the plurality of protruding textured shapes extend from at least the second substrate in a direction towards the resonator.

5. The method according to claim 1, wherein the textured sidewall further comprises a plurality of depressions extending from at least the second substrate in a direction away from resonator.

6. The method according to claim 1, wherein the frictional forces are further reduced by a magnetic field that is produced by a second bias element disposed on a side of the resonator that is opposite to the side of the resonator where the first bias element resides.

7. The method according to claim 1, wherein frictional forces are further reduced by a magnetic field that is produced by the first bias element that is longer than the resonator.

8. The method according to claim 7, wherein the magnetic field lines of the magnetic field enter the resonator at opposing ends of its elongate body.

9. A marker, comprising:
   a marker housing;
   a resonator with a flat planar cross-sectional profile disposed in a cavity formed in a first substrate partially defining the marker housing;
   a second substrate sealing an opening of the cavity;
   a first bias element placed adjacent to the second substrate so that the resonator will be biased by the first bias element when the marker is in use to oscillate at a frequency of a received transmit burst; and
   a physical structure configured to reduce frictional forces between the resonator and at least the second substrate, where the physical structure comprises at least one of
   (a) a portion of the first or second substrate that is located at an interface of the first and second substrates, protrudes out and into the cavity, and physically supports only edges of the resonator,
   (b) a textured sidewall of the cavity defined by the second substrate having a plurality of protruding textured shapes; and
   (c) a non-conductive mesh material, screen material, or perforated sheet material forming the second substrate.

10. The marker according to claim 9, wherein the portion for the first or second structure in (a) comprises a narrow strip of material formed at the interface of the first and second substrate during a heat sealing process.

11. The marker according to claim 9, wherein the narrow strip of material physically lifts the resonator off of the second substrate.

12. The marker according to claim 9, wherein the plurality of textured shape extend from at least the second substrate in a direction towards the resonator.

13. The marker according to claim 9, wherein the textured sidewall further comprises a plurality of depressions extending from at least the second substrate in a direction away from resonator.

14. The marker according to claim 9, wherein the frictional forces are further reduced by a magnetic field that is produced by a second bias element disposed on a side of the resonator that is opposite to the side of the resonator where the first bias element resides.

15. The marker according to claim 9, wherein the frictional forces are further reduced by a magnetic field that is produced by the first bias element that is longer than the resonator.

16. The marker according to claim 15, wherein the magnetic field lines of the magnetic field enter the resonator at opposing ends of its elongate body.

* * * * *